(12) United States Patent
Ashdown (10) Patent No.: US 7,656,366 B2
(45) Date of Patent: Feb. 2, 2010

(54) METHOD AND APPARATUS FOR REDUCING THERMAL STRESS IN LIGHT-EMITTING ELEMENTS

(75) Inventor: Ian Ashdown, West Vancouver (CA)

(73) Assignee: Koninklijke Philips Electronics, N.V., Eindhoven (NL)

( * ) Notice: Subject to any disclaimer, the term of this patent is extended or adjusted under 35 U.S.C. 154(b) by 361 days.

(21) Appl. No.: 11/836,904

(22) Filed: Aug. 10, 2007

(65) Prior Publication Data
US 2008/0042592 A1  Feb. 21, 2008

(51) Int. Cl.
G09G 0/14 (2006.01)
G05F 1/00 (2006.01)

(52) U.S. Cl. .................. 345/46; 345/82; 345/106; 345/101; 345/212; 315/309; 315/307; 315/247; 315/312

(58) Field of Classification Search .......... 315/247, 315/246, 185 S, 200 A, 312–326, 291, 307–311, 315/46, 48–50, 106, 107, 117, 118, 112, 315/116; 345/46, 63, 82, 204, 211, 212, 345/214
See application file for complete search history.

(56) References Cited

U.S. PATENT DOCUMENTS

| 4,190,836 | A | 2/1980 | Kimura et al. | |
|---|---|---|---|---|
| 4,995,044 | A | 2/1991 | Blazo | |
| 6,429,699 | B1 | 8/2002 | Shi et al. | |
| 7,067,995 | B2 | 6/2006 | Gunter et al. | |
| 2006/0202914 | A1 * | 9/2006 | Ashdown | 345/46 |
| 2007/0195025 | A1 * | 8/2007 | Korcharz et al. | 345/82 |

FOREIGN PATENT DOCUMENTS

| EP | 1195925 A2 | 4/2002 |
|---|---|---|
| JP | 2004214519 A | 7/2004 |
| WO | 2004057924 A1 | 7/2004 |

OTHER PUBLICATIONS

Malyutenko, et al: Heat Transfer Mapping in 3-5 Micrometer Planar Light-Emitting Structures, Journal of Applied Physics vol. 93, No. 11, 2003, pp. 9398-9400.

Barton, et al: Life' Tests and Failure Mechanisms of GaN/AlGaN/InGaN Light-Emitting Diodes, SPIE, vol. 3279, 1998, pp. 17-27.

Farkas G. et al: Electrical and Thermal Transient Effects in High Power Optical Devices, Proceedings of the Twentieth Annual IEEE, Semiconductor Thermal Measurement and Management Symposium, 2004, pp. 168-176.

(Continued)

Primary Examiner—Tuyet Vo (57) ABSTRACT

The present invention provides a method and apparatus for controlling the thermal gradient and therefore the thermal stress in light-emitting elements in which the light-emitting elements are exposed to temperature gradients caused by varying drive current under operating conditions. The method and apparatus according to the present invention can reduce the thermal stress in a light-emitting element by adaptively determining a drive current transient for a required change in the drive current from a first drive current state to a desired second drive current state, wherein the drive current transient is adaptively determined in order to substantially minimize the change in applied voltage over time, during the transition time period.

14 Claims, 7 Drawing Sheets

OTHER PUBLICATIONS

W. Folkerts: LED Backlighting Concepts with High Flux LEDs, SID 04, Digest 2004, pp. 1226-1229.

Harbers et al: LED Backlighting for LCD HDTV, Journal of the Society for Information Display, vol. 10, No. 4, 2002, pp. 347-350.

Sugiura, et al: Wide Color Gamut Monitors-LED Backlighting LCD and New Phosphor CRT, Optical Engineering Society Bellingham, WA. Proceedings of Liquid Crystal Materials, Devices and Applications X and Projection Displays X, SPIE-IS&T, vol. 5289, 2004, pp. 151-160.

West, et al: High-Brightness Direct LED Backlight for LCT-TV, SID 2003, Digest, pp. 1262-1265.

Yamada, et al: Sequential-Color LCD Based on OCB with an LED Backlight, Journal of the Society for Information Display vol. 10, No. 1, 2002, pp. 81-85.

* cited by examiner

METHOD AND APPARATUS FOR REDUCING THERMAL STRESS IN LIGHT-EMITTING ELEMENTS

FIELD OF THE INVENTION

The present invention pertains to the field of lighting and in particular to a method and apparatus for controlling thermal stress in light-emitting elements that undergo repetitive or frequent thermal cycling.

BACKGROUND

Advances in the development and improvements of the luminous flux of light-emitting diodes (LEDs) such as solid-state and certain organic or polymer light-emitting diodes have made these devices suitable for use in general illumination applications, including architectural, entertainment, and roadway lighting, for example. As such, light-emitting diodes are becoming increasingly competitive with light sources such as incandescent, fluorescent and high-intensity discharge lamps.

Light-emitting diodes offer a number of advantages and are generally chosen for their ruggedness, long lifetime, high efficiency, low voltage requirements, and the possibility to control the colour and intensity of the emitted light independently. LEDs provide improved performance in comparison to delicate gas discharge lamp, incandescent, and fluorescent lighting systems. Solid-state and improvingly organic light-emitting diodes have the capability to create similar lighting impressions while typically providing greater flexibility than other lighting technologies.

When electrical current through an LED changes rapidly, the heat transfer properties of the device can cause transient temperature gradients exceeding about 3000° C. per cm as shown by Malyutenko et al. in "Heat Transfer Mapping in 3-5 Micrometer Planar Light-Emitting Structures", Journal of Applied Physics 93(11), 2003, pp. 9398-9400. Rapidly increasing drive currents can generate spatially localized hot spots inside the LED with peak temperatures as high as about 150° C. as shown by Barton et al. in "Life Tests and Failure Mechanisms of GaN/AlGaN/InGaN Light-Emitting Diodes", SPIE Vol. 3279, 1998, pp. 17-27 in spite of effective cooling of the LED package, which typically reduces the average junction temperature of the LED die. Also temperature gradients induced by rapid transient drive currents in high-flux LEDs can depend on the initial current as shown by Farkas et al. in "Electrical and Thermal Transient Effects in High Power Optical Devices", Proceedings of the Twentieth Annual IEEE Semiconductor Thermal Measurement and Management Symposium, 2004, pp. 168-176.

As is known, thermally induced excessive mechanical stress inside an LED can lead to premature lumen depreciation. It can also significantly shorten device lifetime due to a number of catastrophic failure modes which can include wire bond fracture or package-die lift-off, for example.

Figure 1:
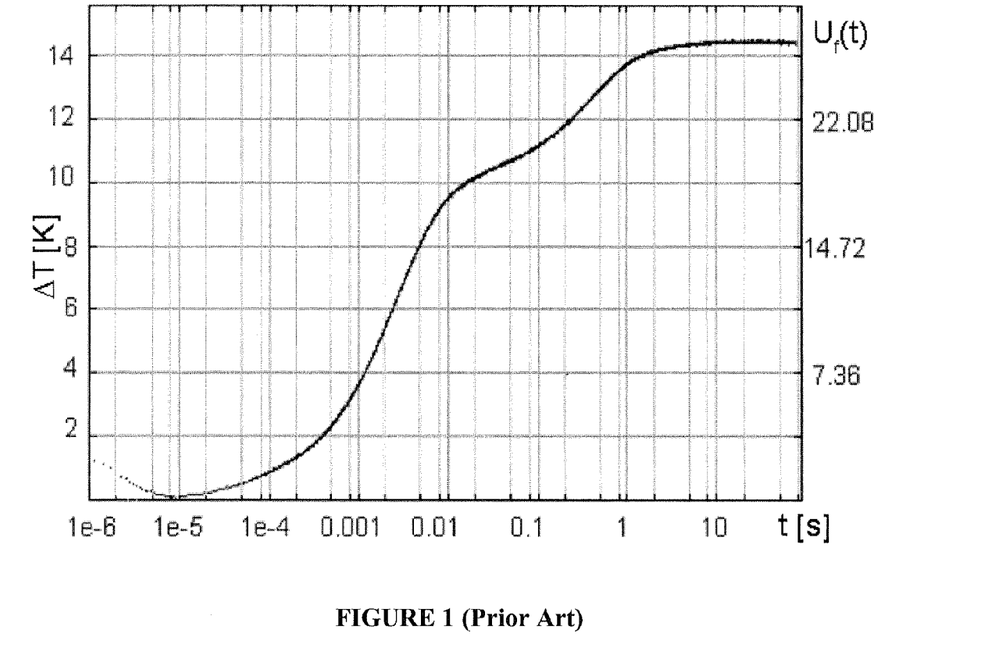
FIG. 1 illustrates the time resolved junction temperature change of a green LED subsequent to switching the drive current from 400 mA to 10 mA (from Farkas et al. 2004) as inferred from the forward voltage indicated on the right ordinate.

FIG. 1 illustrates how the junction temperature of a green LED changes over time subsequent to switching the drive current from about 400 mA to about 10 mA. These changes can be inferred from the measured forward voltage $U_f(t)$ indicated on the right ordinate of FIG. 1. As can be seen, the rate of change of the junction temperature rate after drive current adjustment can reach several thousand Kelvin per second. As is known, temperature change rates correlate to respective temperature gradients according to the heat transfer equation and depending on the heat transfer properties of the LED. There are a number of applications in which excessive temperature gradients or hot spots may occur.

For example, light-emitting diodes have proven useful for backlighting of liquid crystal display (LCD) panels as used in color television and computer displays as is discussed, for example, by Folkert(s) in "LED Backlighting Concepts with High Flux LEDs", SID 04 Digest, 2004, pp. 1226-1229, or by Harbers et al. in "LED Backlighting for LCD HDTV", Journal of the Society for Information Display 10(4), 2002, pp. 347-350, or by Sugiura et al. in "Wide Color Gamut Monitors-LED Backlighting LCD and New Phosphor CRT", Optical Engineering Society Bellingham, Wash.: Proceedings of Liquid Crystal Materials, Devices and Applications X and Projection Displays X, SPIE-IS&T 5289, 2004, pp. 151-160, or by West et al. in "High-brightness direct LED backlight for LCD-TV", SID 2003 Digest, pp. 1262-1265.

As is known in the art, display systems are usually designed to receive signals in which information is formatted as a serial stream of data comprising a sequence of frames. Each frame comprises data necessary for rendering a single still picture. In addition, the information signals can comprise data which can identify the beginning or the end of a frame and can aid with synchronizing the display of a single still picture. For example, each frame can comprise a vertical retrace signal. A sufficiently rapid sequence of frames can generate the impression of a flicker free motion picture. The frames may be generated and rendered at a rate dependent upon the desired application of the display. For a number of reasons, certain types of display systems require that backlight LEDs be turned OFF and ON in synchronicity with, for example, vertical retrace signals. The vertical retrace signal time period can be equivalent to several times the thermal time constant of the backlight LEDs which can result in excessive and potentially damaging thermal gradients inside the backlight LEDs which can be detrimental to LED longevity.

Figure 2:
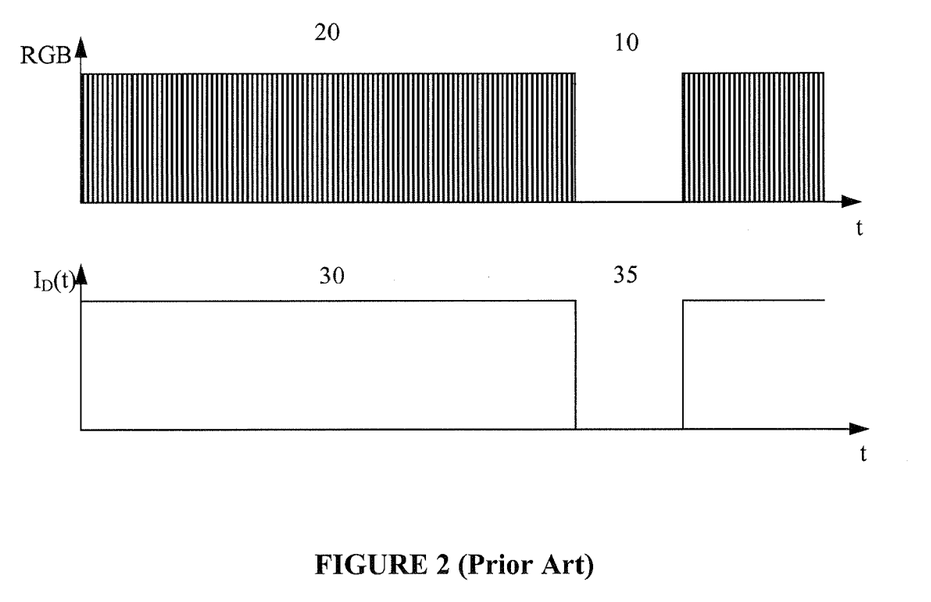
FIG. 2 illustrates the prior art technique of backlight LED blanking in which backlight LEDs are blanked in synchronicity with vertical retrace signals.

For example, as illustrated in FIG. 2, backlighting of a LCD panel can be performed using a technique wherein the backlight LEDs are blanked in synchronicity with vertical retrace signals. In this figure the vertical retrace interval 10 of the video signal 20 for the backlighting of a LCD panel is identical with the OFF time 35 and the ON time 30 of the LED, which is controlled by the LED drive current $I_D(t)$.

For example, Yamada et al. in "Sequential-Color LCD based on OCB with an LED Backlight", Journal of the Society for Information Display 10(1), 2002, pp. 81-85, describes a color video display that utilizes a monochrome LCD with sequentially-enabled red, green, and blue (RGB) LEDs for backlighting. This system is in principle simpler and can likely be more economically manufactured than conventional LCD panels that utilize white backlighting and a matrix of RGB filters, wherein color filter elements are configured for each display pixel. However, each colour of LED can only be energized for about 1.2 milliseconds, or approximately 10% of the time allotted for conventional LCD backlighting. The LEDs must therefore be driven with about ten times the amount of current used for conventional LED backlighting in order to maintain the same LCD screen luminance with the same number of LEDs. As would be readily understood, this operating mode can consequently greatly increase thermal stress on the LED die and its wire bonds, for example.

Prior art drive techniques for high-flux LEDs utilize both analog and digital current control as described by Zukauskas et al. in "Introduction to Solid-State Lighting", Wiley-Interscience, 2002. As discussed, the most common form of digital control is pulse width modulation (PWM). Both digital and analog controlled LED backlight blanking during the vertical retrace interval comprises switching the drive current from full power to zero, waiting for the duration of the retrace interval, and then switching the drive current back to full power.

Figure 3:
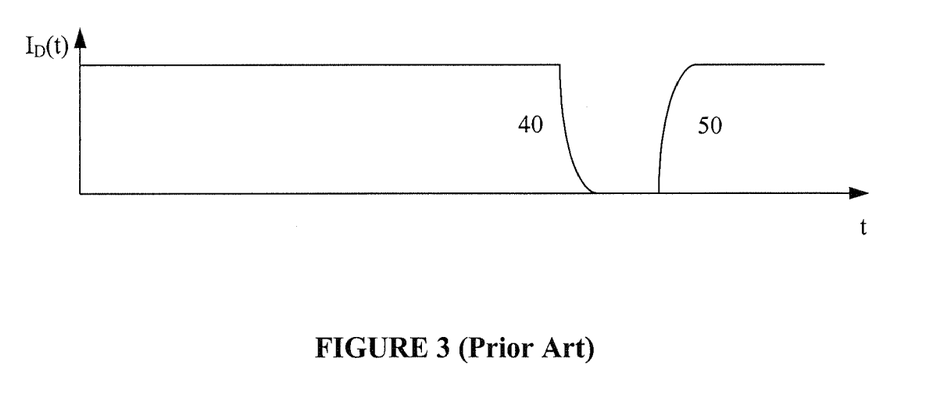
FIG. 3 illustrates prior art drive current transients of a repetitively pulsed LED drive current using a capacitor connected in parallel with the LED.

U.S. Pat. No. 4,190,836 discloses an LED drive circuit wherein the leading and trailing edges of the drive current pulses are extended by a capacitor in parallel to each LED. The effect that the capacitor has on the drive current is illustrated in FIG. 3, wherein the leading edge 40 and the trailing edge 50 of the drive current are elongated by the charging and discharging of the capacitor. However, for this configuration of a LED drive circuit, the capacitor suppresses higher harmonics only in the total current pulse which may otherwise create high frequency electromagnetic radiation which can interfere with radio frequency signals. The total current is the sum of the LED drive current plus the capacitor current. Consequently, the capacitor reduces the drive circuit load for a repetitively-pulsed LED system and can substantially suppress the generation and emission of higher harmonic electromagnetic radiation. The electronic circuit as disclosed, however, does not affect the transient current through each LED nor does it reduce thermal stress in the LEDs.

Therefore, there is a need for a new method and apparatus that can reduce the thermal stress applied to light-emitting elements during operation, for example during repetitive on and off cycling.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a method and apparatus for reducing thermal stress in light-emitting elements. In accordance with an aspect of the present invention, there is provided an apparatus for controlling thermal stress in one or more light-emitting elements during a transition period between a first drive current state and a desired second drive current state of the one or more light-emitting elements, said apparatus comprising: a monitoring module configured to evaluate the first drive current state; a control system configured to determine a drive current transient based on the first drive current state and the desired second drive current state, the control system further configured to evaluate the drive current transient to maintain a forward voltage change rate across the one or more light-emitting elements within a predetermined limit; and a drive current control device controlling the drive current transmitted to the one or more light-emitting elements during the transition period in accordance with the drive current transient.

In accordance with another aspect of the invention, there is provided a method for controlling thermal stress in one or more light-emitting elements during a transition period between a first drive current state and a desired second drive current state of the one or more light-emitting elements, said method comprising the steps of: monitoring the first drive current state; determining a drive current transient based on the first drive current state and the second drive current state, said drive current transient determined in order to maintain a forward voltage change rate across the one or more light-emitting elements within a predetermined limit; and controlling the drive current transmitted to the one or more light-emitting elements during the transition period, according to the drive current transient.

DETAILED DESCRIPTION OF THE INVENTION

Definitions

The term "light-emitting element" (LEE) is used to define a device that emits radiation in a region or combination of regions of the electromagnetic spectrum for example, the visible region, infrared and/or ultraviolet region, when activated by applying a potential difference across it or passing a current through it, for example. Therefore a light-emitting element can have monochromatic, quasi-monochromatic, polychromatic or broadband spectral emission characteristics. Examples of light-emitting elements include semiconductor, organic or polymer/polymeric light-emitting diodes, optically pumped phosphor coated light-emitting diodes, optically pumped nano-crystal light-emitting diodes or other similar devices as would be readily understood by a worker skilled in the art. Furthermore, the term light-emitting element is used to define the specific device that emits the radiation, for example a LED die, and can equally be used to define a combination of the specific device that emits the radiation together with a housing or package within which the specific device or devices are placed.

The term "control system" is used to define a system that can receive input signals, parametrically process the input signals into output signals and provide the output signals. The control system can be operatively connected to one or more peripheral devices via input and/or output interfaces of the control system. The peripheral devices can provide the input signals to or receive the output signals from the control system. A control system can comprise an analog or digital computing device such as a microcontroller, central processing unit (CPU) or input/output interface devices. Interface devices can include A/D or D/A converters to receive or to provide input and output signals in a form adequate for the peripheral devices. Peripheral devices can include user input/output devices for communication of desired user requests or control system parameters between a user and the control system. The control system can include one or more memory devices. The memory devices can have volatile and non-volatile storage character and can include computer memory such as RAM, PROM, EPROM, and EEPROM, floppy disks, compact disks, optical disks, magnetic tape, or the like, wherein control programs (such as software, microcode or firmware) for monitoring or controlling the devices coupled to the control system and/or data can be stored and executed by for example, a CPU. The control system provides the means for controlling the operating conditions of certain peripheral devices in accordance with user-specified operating conditions. The control system can receive user-specified commands by way of a user interface, for example, a keyboard, a touchpad, a touch screen, a console, a visual or acoustic input device or other forms of user input devices well known to those skilled in the art.

The term "drive current control device" is used to define a device that is configured to control the drive current supplied to one or more light-emitting elements. A drive current control device can comprise a drive current actuator or other driver as would be known to a worker skilled in the art. The drive current control device can be integrated into the control system or it can be a separate component receiving operation parameters from the control system.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by one of ordinary skill in the art to which this invention belongs.

The present invention provides a method and apparatus for controlling the thermal gradients and therefore the thermal stress in light-emitting elements that need to be exposed to varying drive current conditions. The described method and apparatus can reduce the thermal stress on a light-emitting elements by adaptively determining a drive current transient between a first drive current state and a second drive current state. The forward voltage across one or more light-emitting elements can be used as an indication of the overall temperature of the light-emitting elements, wherein for a known drive current, insight about the thermal gradients inside a light-emitting element can be inferred from the forward voltage under operating conditions. The forward voltage adequately corresponds to the light-emitting element temperature provided that sufficient time has passed to equilibrate the light-emitting element temperature profile. Stationary thermal conditions in a light-emitting element can prevail within sub-microsecond to sub-second timeframes depending on the size of the light-emitting element and its thermal coupling to the environment.

According to the present invention, a drive current transient is determined in order to reduce the rate of change in forward voltage across the one or more light-emitting elements, when the drive current is being changed between a first drive current and a second drive current. A drive current control device is coupled to the one or more light-emitting elements and the control system, wherein the drive current control device is configured to control the drive current applied to the one or more light-emitting elements during the transient period according to the determined drive current transient. In this manner the apparatus provides a means for controlling the thermal stress in the one or more light-emitting elements during the transient period.

In embodiments of the present invention, the light-emitting element drive currents can generally be controlled by different mechanisms, for example, pulse-width modulation (PWM), pulse-code modulation (PCM) or other mechanisms including analog forms of control. The drive current state can hence be described by, for example, PWM amplitude and PWM duty factor, PCM amplitude and pulse code density or drive current amplitude. The term "drive current state" essentially describes the moving average of the drive current over a time frame which is sufficiently short to resolve thermal responses of the light-emitting element.

Substantially stationary thermal operating conditions can be achieved by choosing suitable control parameters such as adequate pulse frequencies or pulse densities for PWM and PCM control systems. PWM drive frequencies beyond orders of 1 kHz are usually sufficient to maintain the thermal gradients inside the light-emitting element within acceptable limits. However, thermal gradients can increase excessively when significant duty factor changes occur within a few consecutive duty cycles. In general, changes between drive current states at rates which are faster than several times the thermal time constant of the light-emitting elements can expose the device to excessive amounts of thermally induced stress. It is noted that different thermal coupling of the same light-emitting element can cause different thermal gradients and therefore for different implementations of the present invention, while still employing the same light-emitting element, different drive current transients may be applicable in order to reduce these thermal gradients.

As would be readily understood, the rate at which the drive current can be changed from an initial to a following stationary state can depend on parameters such as the particular design and properties of the display, lighting or illumination system in which the present invention is implemented. For example, the type of light-emitting element and the way it is bonded or affixed and/or the type of heat sink associated with the system can influence the maximum rate at which the drive current can be changed to maintain desired thermal gradients.

In one embodiment of the present invention, thermal stress in light-emitting elements of a LEE backlight based display system is controlled in which the drive current and in consequence the die temperatures of the light-emitting elements vary over times of the order of milliseconds. It is noted, that the present invention can be utilized in a display, lighting system, illumination system or other lighting system which requires respective thermal stress management for the light-emitting elements.

Having particular regard to backlighting systems for a display system for example, the light-emitting elements associated with this format of system may need to be synchronously turned ON and OFF along with vertical or horizontal retrace signals depending on the composition of the video signal which is used to drive the display system. The brightness of a backlighting system can therefore be controlled using a PWM controller with a fixed duty cycle. Frame rates of typical video signals are in the range of 50 Hz to 100 Hz with sub-millisecond to millisecond long vertical retrace signals. Respective duty factors for backlighting would therefore be close to one.

A lighting device comprises one or more light-emitting elements for generating light. A drive current control device is coupled to and can selectively supply electrical drive current to each of one or more light-emitting elements, wherein the drive current control device is responsive to drive signals received from a control system. The control system is configured to generate one or more drive signals for transmission to the drive current control device in response to the collected information which can relate to the operational conditions of the lighting device. The drive signals are configured according to the present invention, wherein during drive current transitions between a first drive current state and a second drive current state, thermal stress in the one or more light-emitting elements is mitigated by adaptive modification of the drive current signals, by the evaluation of a drive current transient between the first drive current state and the second drive current state.

Apparatus

The present invention provides an apparatus for controlling thermal stress in one or more light-emitting elements during a transient period which spans between a first drive current state and a desired second drive current state. The apparatus comprises a monitoring module which evaluates the first drive current state and a control system configured to determine a drive current transient based on the first drive current state and the desired second drive current state. The control system is further configured to evaluate the drive current transient in order to maintain a forward voltage change rate across the one or more light-emitting elements within a predetermined limit. The apparatus further comprises a drive current control device for controlling the drive current transmitted to the one or more light-emitting elements during the transient period in accordance with the drive current transient.

In one embodiment of the present invention, the monitoring module for collecting information indicative of the first drive current state is a drive current sensor. This configuration of the monitoring module can provide substantially a direct indication of the drive current state. For example a drive current sensor can be a fixed resistor, a variable resistor, an inductor, a Hall effect current sensor, or other element which has a known voltage-current relationship and can provide a measurement of the current flowing through the one or more light-emitting elements.

In one embodiment of the present invention, the monitoring module is a forward voltage sensor which is used to evaluate the forward voltage supplied to the one or more light-emitting elements, thereby enabling determination of the first drive current supplied thereto.

In another embodiment, the monitoring module is configured to detect certain PWM or PCM parameters or other means that is indicative of the instantaneous operating conditions, namely the drive current state. For example, the first drive current state can be determined or derived from combinations of amplitude, duty factor or pulse density.

For overall intensity control a mechanism for generating a constant PWM amplitude and a varying PWM duty factor can be implemented to provide the typically desired drive current to the one or more light-emitting elements.

Drive current transient control can be implemented by one or a combination of mechanisms. In one embodiment, a drive current transient at the beginning and end of a PWM pulse can be configured by controlling the PWM amplitude. In another embodiment, when the PWM frequency is sufficiently high, the drive current transient can be configured by gradually changing the PWM duty factor. In another embodiment of the present invention and depending on the desired application, a respective amplitude control of the drive current transient can extend over more than one PWM duty cycle.

Figure 4:
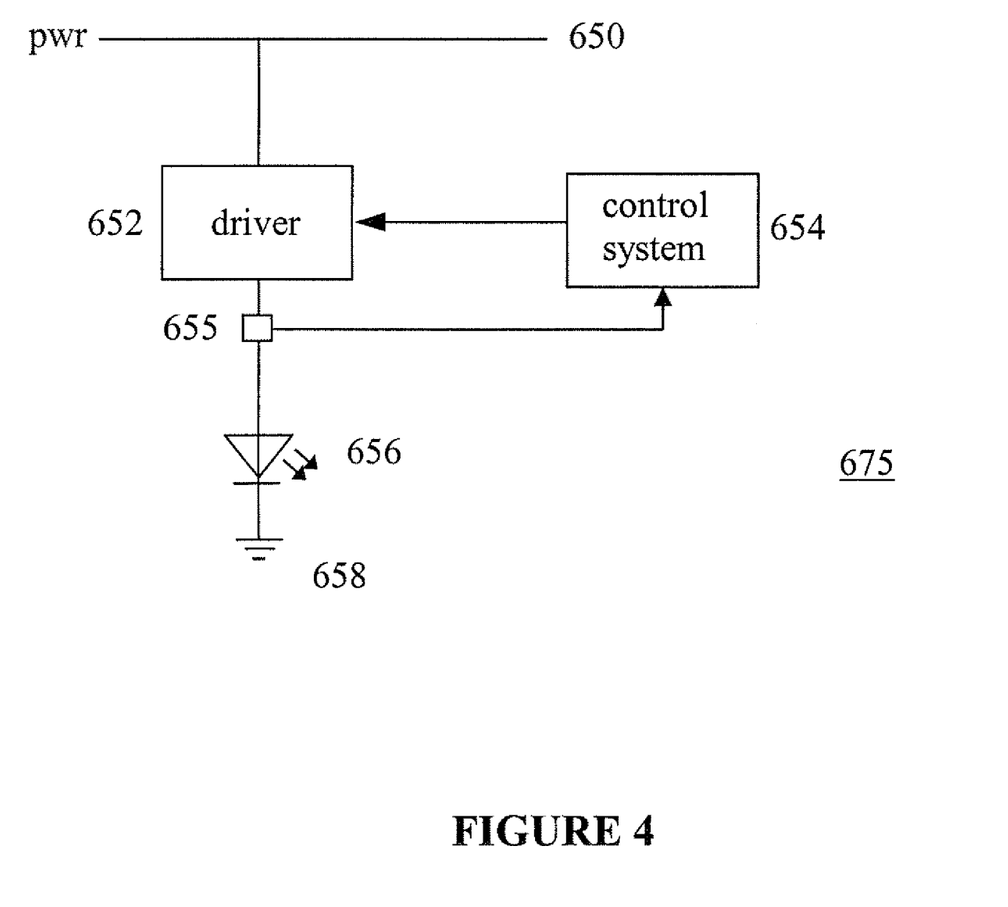
FIG. 4 illustrates a schematic block diagram of a control system according to one embodiment of the present invention.

FIG. 4 is a block diagram of a lighting system 675 having a control system according to one embodiment of the present invention. The control system 654 receives feedback information from the monitoring module 655, which provides information indicative of the first drive current state. Based on the first drive current state and the desired second drive current state, the control system 654 evaluates a drive current transient in order to maintain a forward voltage change rate across the one or more light emitting elements 656 within a predetermined limit. The control system 654 provides control signals to the driver 652 which controls the supply of current to the one or more light-emitting elements 656, based on the evaluated drive current transient. In this manner, upon evaluation of the drive current transient, the driver 652 can provide control of the drive current during the transient period in order to minimize the change in voltage over time during the transient period.

Figure 5:
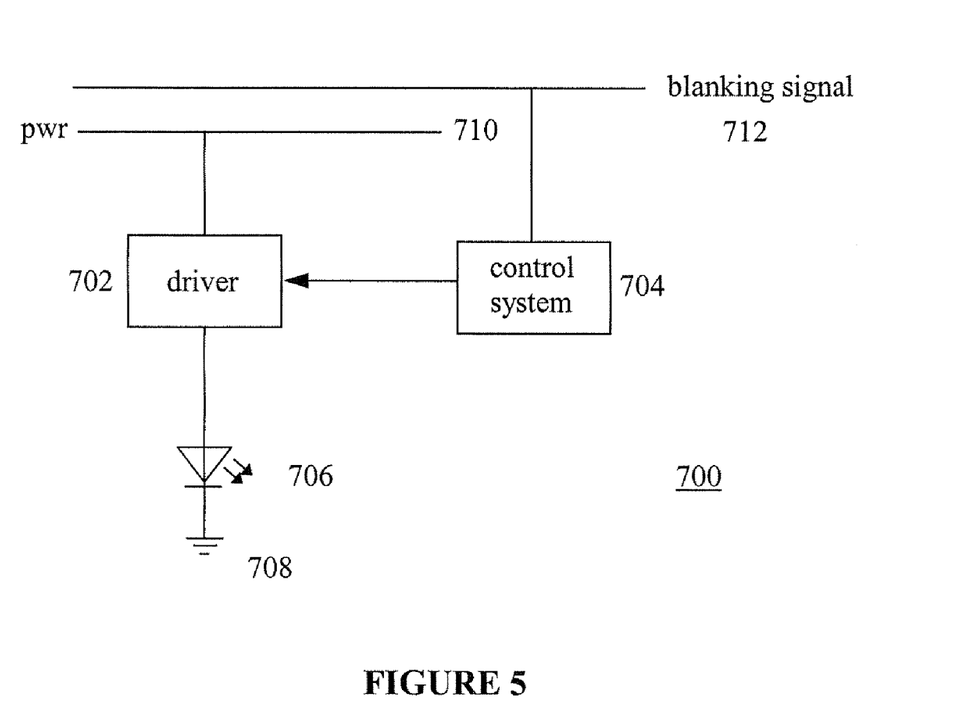
FIG. 5 illustrates a schematic block diagram of a control system according to one embodiment of the present invention.

FIG. 5 is a block diagram of a lighting system 700 configured with a control system according to one embodiment of the present invention which can be used for a back lighting apparatus as the control system is additionally responsive to a blanking signal. The control system 704 monitors a blanking signal line 712 to determine when to initiate and control a light-emitting element drive current transient via a connected driver 702. Furthermore the control system 704 receives feedback information from a monitoring module, which provides information indicative of the first drive current state. Based on the first drive current state and the desired second drive current state, the control system 704 can evaluate the drive current transient in order to maintain a forward voltage change rate across the one or more light emitting elements 706 within a predetermined limit. The one or more light-emitting elements 706 are connected to ground 708 and via the driver 702 to power 710. In this manner, upon evaluation of the predetermined drive current transient, the drive current control device can provide control of the drive current during the transient period in order to minimize the change in voltage over time during the transient period.

Based on the above it would be readily understood by a worker skilled in the art how to modify the block diagram as illustrated in FIG. 4 or 5, in order to reduce thermal stress in light-emitting elements under operating conditions.

In one embodiment of the present invention, changing the drive current supplied to the one or more light-emitting elements can be enabled by a controllable variable power supply, a controllable variable resistor to adjust the current from a constant current supply, and/or pulse width or pulse code modulation of an otherwise constant drive current, for example, or other manner as would be readily understood by a worker skilled in the art.

In one embodiment of the present invention, for digital control of the current supplied to the one or more light-emitting elements, the duty factor or pulse density of a sufficiently high frequency pulse train can be held constant while the pulse amplitude is smoothly changed over an adequate time frame, which can define a drive current transient enabling the transition between a first drive current state and a second drive current state.

Drive Current Transient Evaluation

A drive current transient is adaptively determined for a transient period between a first drive current state and a second drive current state, wherein the drive current transient is determined in order to maintain the forward voltage change rate within predetermined limits during the transient period. Enabling adequate control of the change in the forward voltage during a transition period between a first drive current state and a second drive current state, can reduce the thermal stress induced on the light-emitting elements during the transient period.

The evaluation of a drive current transient is performed by initially evaluating the instant or first drive current state of one or more light-emitting elements. As described above the first drive current state can be detected directly or can be derived from combinations of amplitude, duty factor or pulse density, for example. Subsequently, based on the evaluated information relating to the current operational characteristics of the light-emitting elements and together with information relating to the characteristics of the lighting device itself, for example, thermal management design, type of light-emitting element and the like, the control system can evaluate a drive current transient for the transition period between the first drive current state and the second drive current state.

Upon evaluation of the drive current transient, the control system will provide drive current signals to the drive current control device in order that the drive current or the duty cycle of the drive current is temporally adjusted according to the determined drive current transient. The adjustment can be either an increase or decrease of the drive current depending on the relationship between the first drive current state and the second drive current state.

Figure 6:
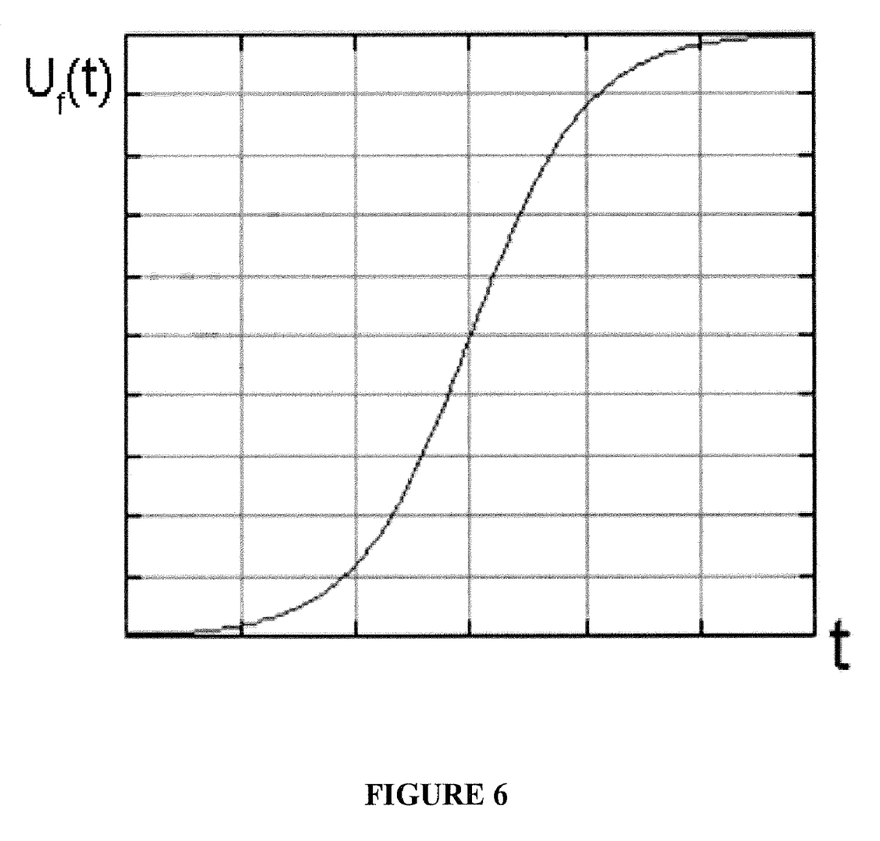
FIG. 6 illustrates a forward voltage transient $U_f(t)$ according to an embodiment of the present invention.

According to one embodiment of the present invention, FIG. 6 illustrates schematically an example drive current transient for a desired forward voltage transition $U_f(t)$. The forward voltage change can have a sigmoidal time dependence, for example, $U_f(t) \propto (1+\exp(-t/\alpha))^{-1}$ or other substantially smooth transient that can reduce thermal gradients inside the light-emitting element, wherein the parameter a can be suitably chosen as a positive number and called a transient rate constant.

In one embodiment of the present invention, drive current transient $U_f(t)$ can be determined by solving the heat transfer equation for an implementation of the present invention. The steps for the evaluation and application of the desired drive current transient can be determined depending on whether the drive current is controlled in an analog or digital fashion.

Other drive current transient configurations can be used and can have a shape including for example, linear, parabolic, curvilinear, exponential or other shape as would be readily understood, provided that the rate of change of the forward voltage is maintained within a predetermined range thereby mitigating thermal stress in the one or more light-emitting elements.

Analog Current Control

Analog current control refers to control of continuous current, here synonymously used with analog current, through light-emitting elements irrespective of whether the control is achieved in a digital or analog fashion.

In one embodiment of the present invention, an analog light-emitting element drive current control device can control drive current transients according to a predetermined transient shape, for example a linear, exponential, sigmoidal or other transient shape which can reduce drive current induced thermal stress in the one or more light-emitting elements by substantially minimizing the rate of change in the applied forward voltage. A control system for the control of the shape of a drive current transient can comprise a predetermined hard wired electronic drive circuit or a programmable digitally controlled analog drive circuit, for example.

In one embodiment of the present invention, a digitally controlled analog drive circuit is used. A digitally controlled analog drive circuit can provide greater flexibility and adaptability, however this configuration may be more complex and less cost effective.

Figure 7:
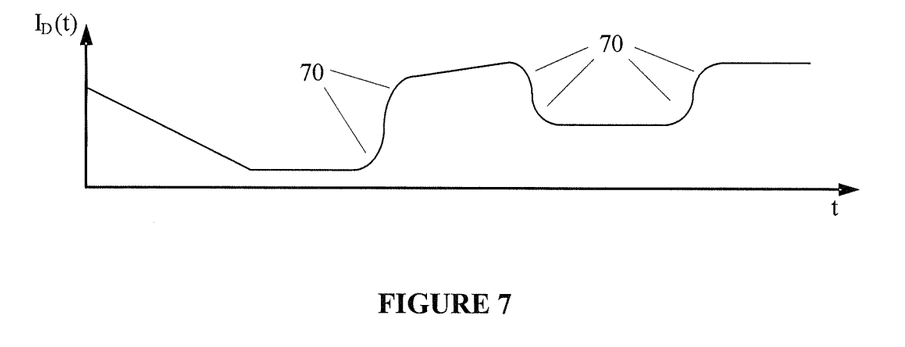
FIG. 7 illustrates drive current transient shaping of an analog drive current according to an embodiment of the present invention.

FIG. 7 illustrates an example time dependency of an analog drive current which provides substantially smooth drive current transients 70 between various continuously varying high and low level drive currents according to one embodiment of the present invention. When the drive current is controlled in an analog fashion, the apparatus and method according to the present invention can determine a drive current transient based upon the instant or first drive current state and the desired or second drive current state. Alternatively, substantially abrupt drive current changes can be dilated by the control system to desirably follow a smooth drive current transient 70 in order to limit the thermal gradients and stress inside the one or more light-emitting elements. Drive current control signals are then generated and provided to the drive current control device to affect a respective drive current transient.

For example, when a closed loop control system using optical sensors is additionally equipped with forward voltage sensors the control system can be configured to maintain a desired light-emitting element brightness while also limiting forward voltage change rates. This configuration can enable the control system to control the one or more light-emitting elements in order to quickly and stably make operational adjustments of the one or more light-emitting elements without undesired brightness deviations.

Digital Current Control

Digital current control refers to control of non-continuous current, for example, pulsed current, here synonymously used with digital current, through light-emitting elements irrespective of whether the control is achieved in a digital or analog fashion.

In one embodiment of the present invention, a digital light-emitting element drive current control device is used to control the transients of the drive current by, for example, adjusting the PWM duty factors or the PCM pulse rate of a sequence of PWM or PCM pulses, respectively, such that the PWM or PCM average current follows the determined drive current transient shape, for example a linear, sigmoidal, exponential or other transient shape which can reduce drive current induced thermal stress in the one or more light-emitting elements. It is understood that the digital drive current control system can utilize digital control techniques other than PWM or PCM.

In one embodiment of the present invention, when drive current control is enabled by a digital drive current control device, the apparatus according to the present invention can determine the first drive current state by, for example, the instant duty factor or directly sensing thereof. The control system subsequently evaluates a sequence of drive current transients to transition the time averaged drive current from the instant duty factor indicative of the first drive current state to the desired duty factor indicative of the desired second drive current state. Control signals are then provided to the drive current control device in order to accordingly increase or decrease the duty cycle or the pulse density over a predetermined period of time.

Figure 8:
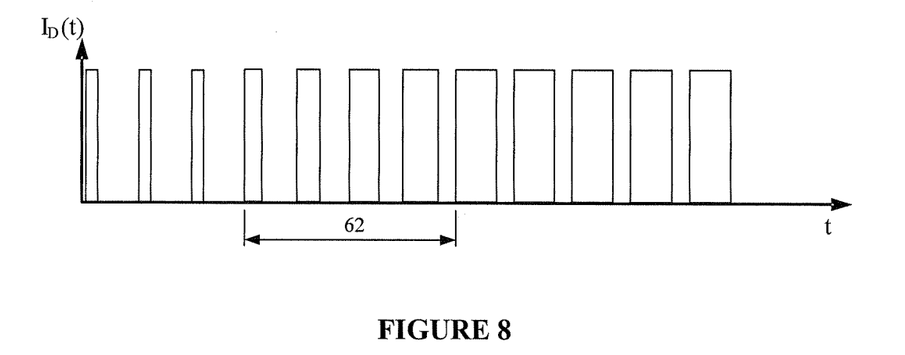
FIG. 8 illustrates a transient pulse sequence of a pulse width modulated drive current according to an embodiment of the present invention.

For example, FIG. 8 illustrates a sequence of PWM drive pulses with increasing duty cycle over time frame 62 according to an embodiment of the present invention. This can then be considered a form of substantially smooth drive current transient as it is configured to substantially avoid abrupt jumps in average drive current by smoothly transitioning the average drive current and hence avoid abrupt jumps in temperature gradient and thermally induced stress from one duty cycle to the next.

In one embodiment of the present invention, when the pulse frequency is sufficiently high such that the temperature gradients inside the light-emitting element only fluctuate negligibly while being repetitively activated and deactivated by the pulses, the exact shapes of the rising and falling shoulders of the pulses generally will likely not induce significant amounts of thermally induced stress.

Figure 9:
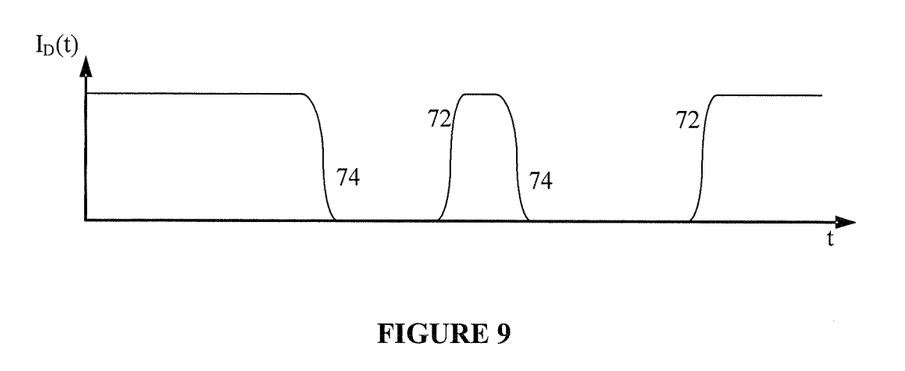
FIG. 9 illustrates drive current transient shaping of a pulsed drive current according to an embodiment of the present invention.

In one embodiment, the rising and falling shoulders of drive current pulses can be configured to follow smooth transients whenever the OFF times are long in comparison to the characteristic thermal dynamics of the light-emitting element. Comparatively long OFF times can occur whenever the pulse frequencies or pulse densities are substantially low. An example of drive current pulses with smooth drive current transients is illustrated in FIG. 9 which shows smooth rising 72 and falling 74 drive current transients.

Figure 10:
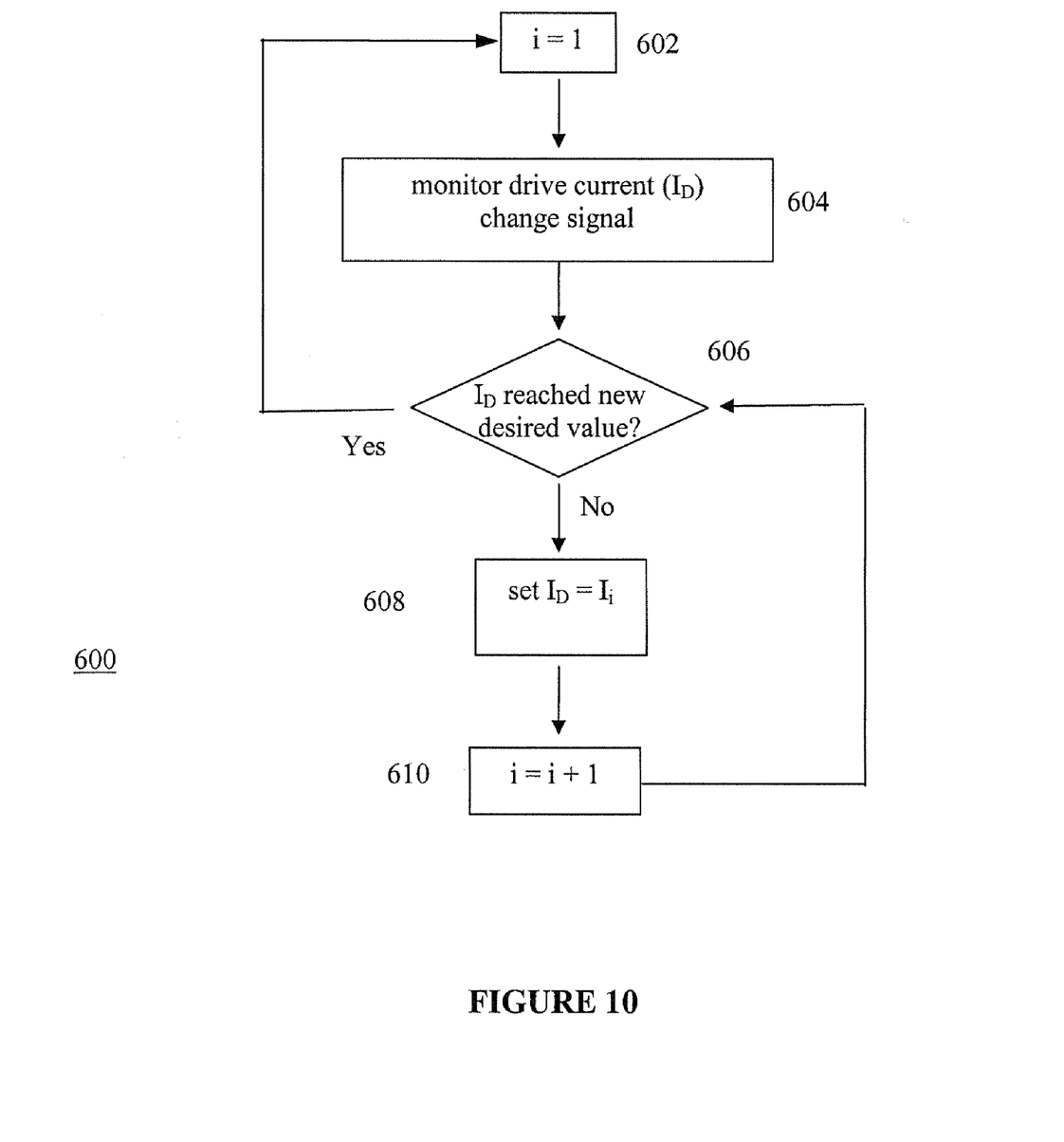
FIG. 10 illustrates a flowchart for a drive current control sequence according to one embodiment of the present invention.

FIG. 10 illustrates a flowchart for a drive current control sequence 600 according to one embodiment of the present invention. The drive current control sequence 600 controls the drive current in a feed forward fashion. It is noted that drive current transients can also be controlled in a feedback control fashion by utilizing optical sensors and forward voltage sensors, for example. The sequence is initialized in step 602 where a parameter i is initially set to 1, and the drive current change signal, for example, the vertical retrace signal, is monitored in step 604. The present value of the drive current is compared to the desired new drive current value in step 606. If the values of the new drive current and the present drive current differ, the present drive current is set to a new drive current value in step 608 according to a predetermined or adaptive drive current transient. The change in the drive current during the transient period, namely the drive current transient, can be determined based on a predetermined linear or non-linear temporal function, which is chosen such that the change rate of the forward voltage remains within predetermined limits during the transient period and the drive current can transition from a first drive current state to a second drive current state, while substantially reducing thermal stress induced in the one or more light-emitting elements.

It is obvious that the foregoing embodiments of the invention are examples and can be varied in many ways. Such present or future variations are not to be regarded as a departure from the spirit and scope of the invention, and all such modifications, as would be obvious in the art, are intended to be included within the scope of the following claims.

I claim:

1. An apparatus for controlling thermal stress in one or more light-emitting elements during a transition period between a first drive current state and a desired second drive current state of the one or more light-emitting elements, said apparatus comprising:
    a) a monitoring module configured to evaluate the first drive current state;
    b) a control system configured to determine a drive current transient based on the first drive current state and the desired second drive current state, the control system further configured to evaluate the drive current transient to maintain a forward voltage change rate across the one or more light-emitting elements within a predetermined limit; and
    c) a drive current control device controlling the drive current transmitted to the one or more light-emitting elements during the transition period in accordance with the drive current transient.

2. The apparatus according to claim 1, wherein the drive current control device is configured to control the drive current using pulse width modulation or pulse code modulation or analog control.

3. The apparatus according to claim 1, wherein the monitoring module is a drive current sensor.

4. The apparatus according to claim 3, wherein the drive current sensor is selected from the group comprising a fixed resistor, a variable resistor, an inductor and a Hall effect current sensor.

5. The apparatus according to claim 1, wherein the monitoring module is a forward voltage sensor.

6. The apparatus according to claim 1, wherein the drive current control device is configured to control the drive current using pulse width modulation or pulse code modulation and wherein the monitoring module is configured to detect parameters of the pulse width modulation or the pulse code modulation.

7. The apparatus according to claim 1 for use in a backlighting apparatus, wherein the control system is configured to be responsive to a blanking signal, wherein control of the one or more light-emitting elements is synchronous with the blanking signal.

8. The apparatus according to claim 1, wherein the drive current transient has a shape selected from the group comprising linear, parabolic, curvilinear, exponential and sigmoidal.

9. A method for controlling thermal stress in one or more light-emitting elements during a transition period between a first drive current state and a desired second drive current state of the one or more light-emitting elements, said method comprising the steps of:
    a) monitoring the first drive current state;
    b) determining a drive current transient based on the first drive current state and the second drive current state, said drive current transient determined in order to maintain a forward voltage change rate across the one or more light-emitting elements within a predetermined limit; and
    c) controlling the drive current transmitted to the one or more light-emitting elements during the transition period, according to the drive current transient.

10. The method according to claim 9, wherein the drive current transient has a shape selected from the group comprising linear, parabolic, curvilinear, exponential and sigmoidal.

11. The method according to claim 9, wherein monitoring the first drive current state comprises collecting drive current data.

12. The method according to claim 9, wherein monitoring the first drive current state comprises collecting forward voltage data.

13. The method according to claim 9, wherein controlling the drive current is performed using pulse width modulation or pulse code modulation and wherein monitoring the first drive current state comprises detecting parameters of the pulse width modulation or the pulse code modulation.

14. The method according to claim 9, wherein controlling the drive current is performed using pulse width modulation or pulse code modulation or analog control.

* * * * *